United States Patent
Lu et al.

(10) Patent No.: US 10,141,323 B2
(45) Date of Patent: Nov. 27, 2018

(54) NON-VOLATILE MEMORY AND METHOD OF MANUFACTURING THE SAME

(71) Applicant: TAIWAN SEMICONDUCTOR MANUFACTURING COMPANY LTD., Hsinchu (TW)

(72) Inventors: Hau-Yan Lu, Hsinchu (TW); Shih-Hsien Chen, Hsinchu County (TW); Chun-Yao Ko, Hsinchu (TW); Felix Ying-Kit Tsui, Cupertino, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 46 days.

(21) Appl. No.: 14/987,452

(22) Filed: Jan. 4, 2016

(65) Prior Publication Data
US 2017/0194342 A1  Jul. 6, 2017

(51) Int. Cl.
*H01L 27/115* (2017.01)
*H01L 27/11568* (2017.01)
*H01L 27/11521* (2017.01)

(52) U.S. Cl.
CPC .. *H01L 27/11568* (2013.01); *H01L 27/11521* (2013.01)

(58) Field of Classification Search
CPC ......... H01L 2924/0002; H01L 2924/00; H01L 29/66825; H01L 23/528; H01L 27/0207; H01L 27/11558; H01L 29/1095; H01L 29/4916; H01L 29/66181; H01L 29/94;
(Continued)

(56) References Cited

U.S. PATENT DOCUMENTS 6,411,545 B1 * 6/2002 Caywood ............... G11C 14/00
                                                      365/156
7,087,953 B2    8/2006 Lee
7,099,192 B2    8/2006 Wang et al.
(Continued)

FOREIGN PATENT DOCUMENTS

TW    I-379418    11/1994
TW    I-479331    3/2002
(Continued)

OTHER PUBLICATIONS

Office Action from German Patent Office dated Sep. 9, 2016 for corresponding German application 102016101082.0.

*Primary Examiner* — Edward Chin
(74) *Attorney, Agent, or Firm* — Haynes and Boone, LLP (57) ABSTRACT

A semiconductor device is provided. The semiconductor device comprises a first active region, a second active region and a third active region, a first poly region, a second poly region, a third poly region, a first doped region and a second doped region. The first active region, the second active region and the third active region are separated and parallel with each other. The first poly region is arranged over the first and second active regions. The second poly region is arranged over the first and second active regions. The third poly region is arranged over the second and third active regions. The first doped region is in the second active region and between the first poly region and the second poly region. The second doped region is in the second active region and between the second poly region and the third poly region.

20 Claims, 5 Drawing Sheets

(58) Field of Classification Search
CPC ......... H01L 27/11521; H01L 27/11526; H01L 27/11531
USPC ............... 257/315, E21.679, E29.129, 296; 438/266, 267
See application file for complete search history.

(56) References Cited

U.S. PATENT DOCUMENTS

| | | | |
|---|---|---|---|
| 7,553,725 B2 | 6/2009 | Jeon et al. | |
| 7,612,397 B2 | 11/2009 | Ueda et al. | |
| 7,818,396 B2 | 10/2010 | Dolin et al. | |
| 8,394,700 B2* | 3/2013 | Scott | H01L 27/11521 257/315 |
| 9,620,594 B2* | 4/2017 | Chen | H01L 29/1095 |
| 2003/0111672 A1 | 6/2003 | Cavins et al. | |
| 2006/0291281 A1 | 12/2006 | Wang et al. | |
| 2007/0040197 A1 | 2/2007 | Yang et al. | |
| 2009/0159946 A1* | 6/2009 | Huang | G11C 16/0441 257/296 |
| 2009/0290417 A1* | 11/2009 | Park | G11C 16/0433 365/185.08 |
| 2015/0054043 A1* | 2/2015 | Tan | H01L 29/42324 257/298 |
| 2015/0102413 A1* | 4/2015 | Azmat | H01L 27/11807 257/365 |
| 2016/0093628 A1* | 3/2016 | Chen | H01L 29/66825 257/296 |

FOREIGN PATENT DOCUMENTS

| | | |
|---|---|---|
| TW | I-265626 | 11/2006 |
| TW | I-270977 | 1/2007 |
| TW | I-284964 | 8/2007 |
| TW | I-305680 | 1/2009 |
| TW | I-375331 | 10/2012 |
| WO | WO 2008036552 | 3/2008 |

* cited by examiner

NON-VOLATILE MEMORY AND METHOD OF MANUFACTURING THE SAME

BACKGROUND

Non-volatile memory (NVM) devices, such as flash memory and electrically erasable programmable read only memory (EEPROM), are well known in the art. A NVM device does not lose its data when the system or device is turned off. As the demand for small size portable electrical devices such as cellular phones increases, there is a great need for embedded memory. High-performance embedded memory is an important component in VLSI or ULSI because of its high-speed and wide bus-width capability, which eliminates inter-chip communication. Therefore, it is desirable to develop a NVM device, which is fully compatible with CMOS logic processes and has low power consumption, improved writing efficiency, low cost and high packing density.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAILED DESCRIPTION

Embodiments, or examples, of the disclosure illustrated in the drawings are now described using specific language. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numerals may be repeated throughout the embodiments, but this does not necessarily require that feature(s) of one embodiment apply to another embodiment, even if they share the same reference numeral.

Figure 1A:
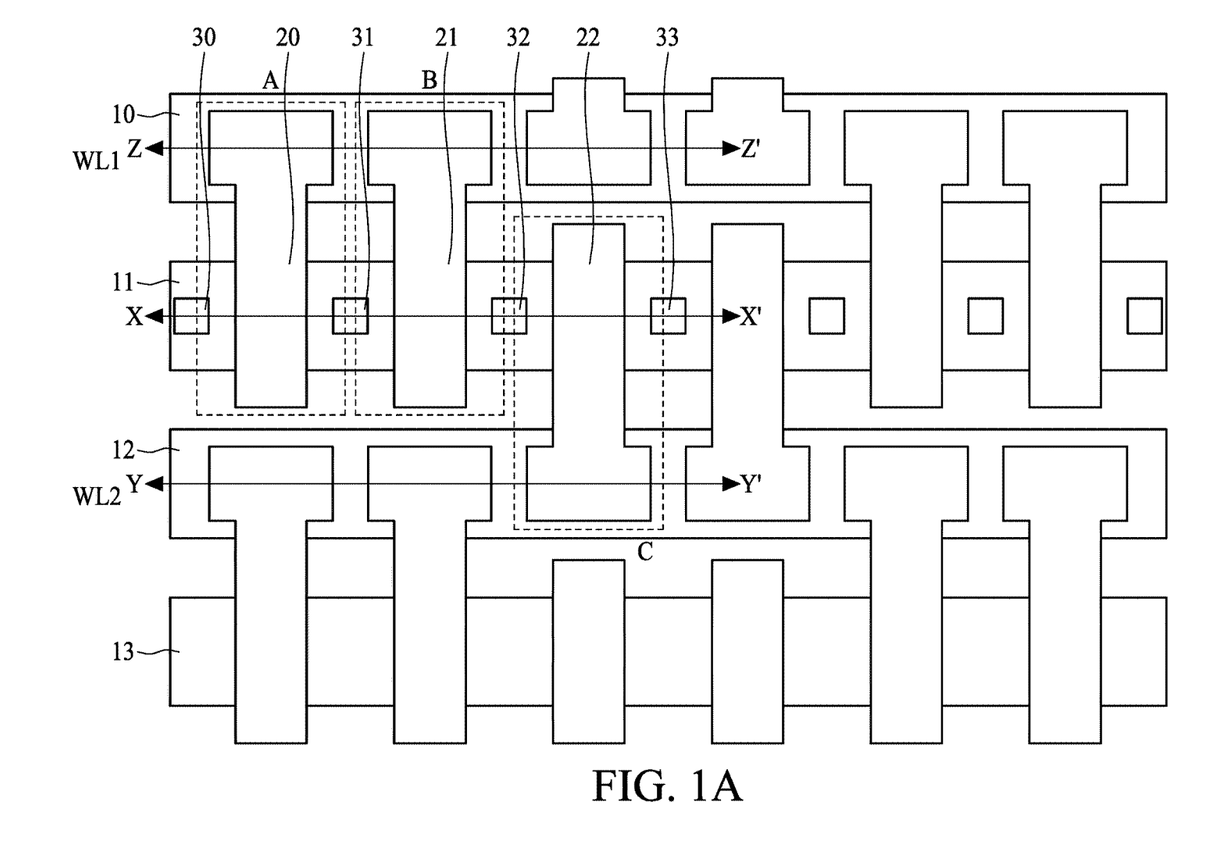
FIG. 1A is a top view of a non-volatile memory array, in accordance with some embodiments.

FIG. 1A illustrates a top view of a non-volatile memory array 1 in accordance with some embodiments of the present disclosure. Referring to FIG. 1, the non-volatile memory array 1 comprises a plurality of bit cells A, B, C, and active regions 10 to 13 separated from each other by isolation regions (not numbered). For convenience and brevity, only a portion of the non-volatile memory array 1 is shown in FIG. 1A.

The bit cell A comprises a poly region 20 and doped regions 30, 31. The poly region 20 is disposed over the active regions 10 and 11, which are immediately adjacent to each other. The doped region 30 is in the active region 11 and at one side of the poly region 20, while the doped region 31 is in the active region 11 and at the other side of the poly region 20. In operation, the active region 10 serves as a word line. Moreover, the doped region 30 can serve as a drain region or a bit line, while the doped region 31 can serve as a source region or a source line. In an embodiment, a ratio of an overlapped area between the poly region 20 and the active region 10 to an overlapped area between the poly region 20 and the active region 11 is greater than one (1).

The bit cell B comprises a poly region 21 and doped regions 31, 32. The poly region 21 is disposed over the active regions 10 and 11. The doped region 31 is in the active region 11 and at one side of the poly region 21, while the doped region 32 is in the active region 11 and at the other side of the poly region 21. In operation, the active region 10 serves as a word line. Moreover, the doped region 31 can serve as a source region or a source line, while the doped region 32 can serve as a drain region or a bit line. As illustrated in FIG. 1A, the bit cell B is located immediately adjacent to the bit cell A and they share the same source line 31. In an embodiment, a ratio of an overlapped area between the poly region 21 and the active region 10 to an overlapped area between the poly region 21 and the active region 11 is greater than 1.

The bit cell C comprises a poly region 22 and doped regions 32, 33. The poly region 22 is disposed over the active regions 11 and 12, which are immediately adjacent to each other. The doped region 32 is in the active region 11 and at one side of the poly region 22, while the doped region 33 is in the active region 11 and at the other side of the poly region 22. In operation, the active region 12 serves as a word line. Moreover, the doped region 32 can serve as a drain region or a bit line, while the doped region 33 can serve as a source region or a source line. As illustrated in FIG. 1A, the bit cell C is located immediately adjacent to the bit cell B and they share the same bit line 32. In an embodiment, a ratio of an overlapped area between the poly region 22 and the active region 12 to an overlapped area between the poly region 22 and the active region 11 is greater than 1.

For illustration, the non-volatile memory array 1 shown in FIG. 1A comprises several bit cells. In the arrangement of the bit cells, the poly region of each bit cell and the poly region of its adjacent bit cell extend over a same pair of active regions if the bit cell and the adjacent bit cell share the same source line. Moreover, the poly region of each bit cell and the poly region of its adjacent bit cell extend over a different pair of active regions if the bit cell and the adjacent bit cell share the same bit line.

During a writing operation of a non-volatile memory, a selected word line (active region) is applied with a positive voltage of about 3-8 volts (V), depending on the design of the non-volatile memory. In addition, a selected bit line is applied with a voltage of 0V or 3-8V, depending on the desired logical state (logical value 1 or 0) to be written. In some existing non-volatile memory arrays, since each bit cell and its adjacent bit cell share a same bit line, the active regions of two adjacent bit cells should be separated in order to avoid writing an undesired logical value into one of the two adjacent bit cells. However, separated active regions would increase the total area of the non-volatile memory array, and hence the manufacturing cost.

In the present disclosure, because the poly regions of two adjacent bit cells extend over a different pair of active regions if they share a same bit line, the wrongly writing operation can be avoided without separating the active region of two adjacent bit cells. For example, if it is desirable to write a logical value 0 to the bit cell B, a positive voltage is applied to the word line WL1 (the active region 10) while a voltage of 0V is applied to the bit line 32. Since the poly region 22 of the bit cell C extends over the active regions 11 and 12 while the poly region 21 of the bit cell B extends over the active regions 10 and 11, the logical value 0 would not be wrongly written to the bit cell C. Because the active regions of the non-volatile memory array 1 extend continuously in parallel with each other, the non-volatile memory array 1 of the present disclosure has a smaller area in comparison with the existing non-volatile memory arrays. In an embodiment, a bit cell of the non-volatile memory array 1 of the present disclosure is approximately 45% smaller than that of an existing non-volatile memory array. By reducing the area of each bit cell, the total area of a chip embedded with the non-volatile memory array 1 and the manufacturing cost can also be reduced.

Figure 1B:
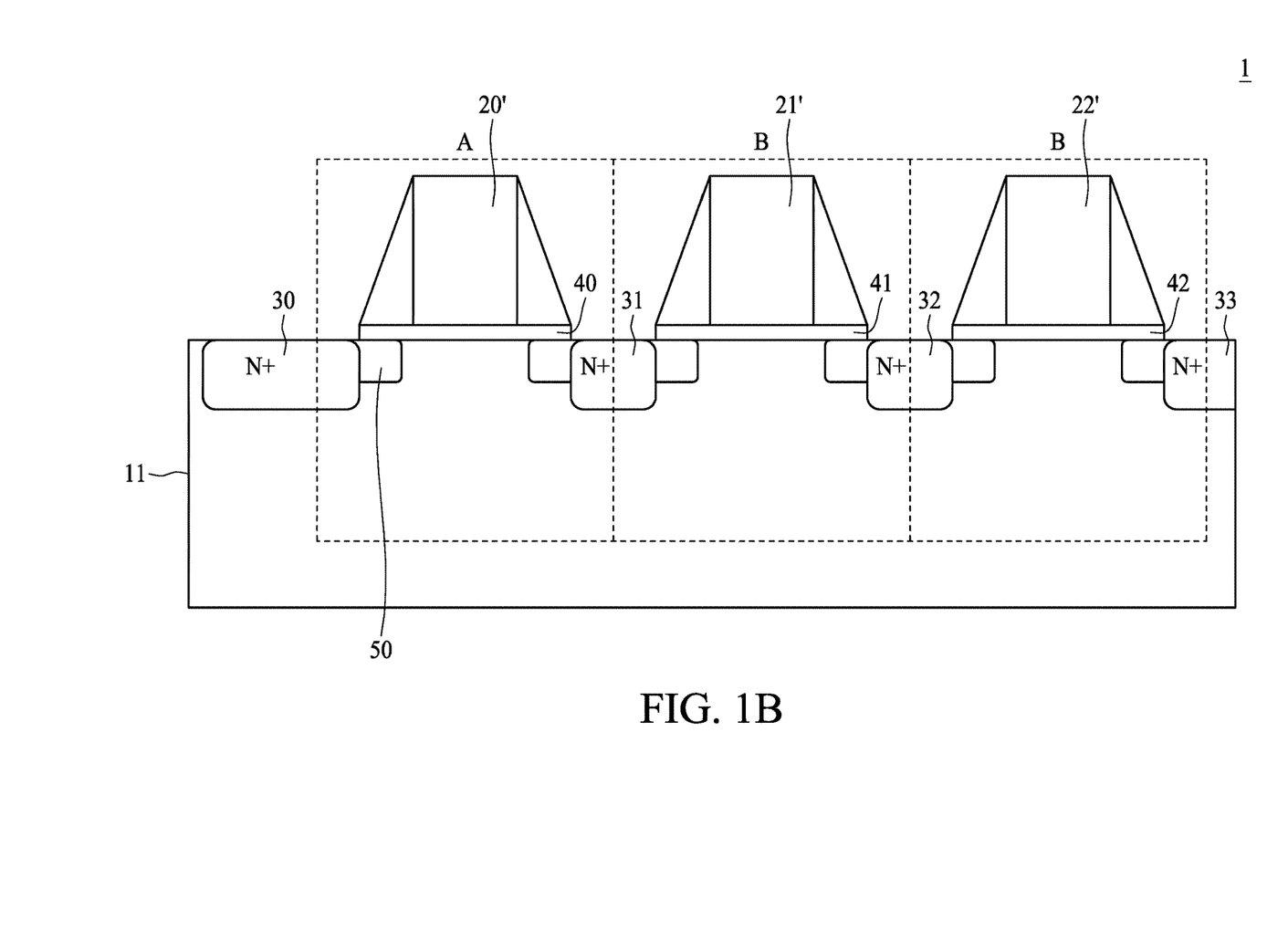
FIGS. 1B-1D are cross-sectional views of a non-volatile memory array of FIG. 1A, in accordance with some embodiments.

FIG. 1B is a cross-sectional view of a portion of the non-volatile memory array 1 shown in FIG. 1A, taken along the line X-X' in accordance with an embodiment of the present disclosure. The non-volatile memory 1 shown in FIG. 1B comprises a substrate (not shown), a well region 11 and a portion each of the bit cells A, B and C.

The substrate may be a p type doped substrate, or an n type doped substrate, which means that the semiconductor substrate may be doped with either n type or p type impurities. The substrate is formed from silicon, gallium arsenide, silicon germanium, silicon carbon, or other known semiconductor materials used in semiconductor device processing. Although a semiconductor substrate is used in the illustrated examples presented herein, in other alternative embodiments, epitaxially grown semiconductor materials or silicon on insulator (SOI) layers may be used as the substrate.

It is known in the art that dopant impurities can be implanted into a semiconductor material to form a p type or an n type material. A p type material may be further classified as p++ (very highly doped), p+ (heavily doped), p (moderately doped), p− (lightly doped), p− (very lightly doped), type materials, depending on the concentration of the dopant. If a material is stated to be a p type material, it is doped with p type impurities and it may be any of the p++, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials. Dopant atoms for p type materials include boron, for example. In n type materials, dopant atoms include phosphorous, arsenic, and antimony, for example. Doping may be done through ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allows for in-situ doping during the epitaxial processes. It is also know in the art that implantation can be done through certain materials, such as thin oxide layers.

The well region 11 extends continuously in the bit cells A, B and C. The doping concentration accounts for the well region 11 and the diffusion may vary as the process and design vary. Doping concentrations at a p type material or an n type material may range from $10^{14}$ atoms/cm$^3$ to $10^{22}$ atoms/cm$^3$, with a p+/n+ material having a concentration higher than about $10^{18}$/cm$^3$, for example. Some other ranges of concentration may be used, such as an n−−/p−− material with a doping concentration lower than $10^{14}$ atoms/cm$^3$, an n−/p− material with a doping concentration ranging from $10^{14}$ atoms/cm$^3$ to $10^{16}$ atoms/cm$^3$, an n/p material with a doping concentration ranging from $10^{16}$ atoms/cm$^3$ to $10^{18}$ atoms/cm$^3$, an n+/p+ material with a doping concentration ranging from $10^{18}$ atoms/cm$^3$ to $10^{20}$ atoms/cm$^3$, and an n++/p++ material with a doping concentration higher than $10^{20}$ atoms/cm$^3$. Further alternative ranges of concentrations may be used, such as an n−−/p−− material with a doping concentration ranging around $10^{15}$ to $10^{18}$/cm$^3$, and an n−/p− material with a doping concentration 5 to 100 times heavier than the concentration of an n−−/p−− material.

The bit cell A comprises a gate region 20', a gate dielectric layer 40, a drain region 30, a source region 31 and a lightly doped region 50. The gate region 20' is disposed over the well region 11 and the gate dielectric layer 40 is disposed between the gate region 20' and the well region 11. According to an embodiment of the present disclosure, the gate dielectric layer 40 is silicon dioxide that is grown on the well 11 of the substrate by, for example, thermal oxidation, but not limited thereto. Other suitable gate dielectric materials may include, for example, oxide-nitride-oxide (ONO) or compound silicon oxide. The gate region 20' may comprise a doped polysilicon, but not limited thereto. Further, a silicide (not shown) may be formed on the gate region 20' in order to reduce contact resistance.

The drain region 30 and the source region 31 are of the same conductivity type and are within the well region 11. The drain region 30 may have a drain contact (not shown in the drawing). The source region 31 may have a source contact (not shown in the drawing). Both the drain region 30 and the source region 31 are formed by implanting ions of an impurity of the same conductivity type, such as an n type, into the well region 11. The drain region 30 and the source region 31 may be formed by implanting an n type dopant such as phosphorous at a concentration between about $1\times10^{19}$/cm$^3$ and about $2\times10^{21}$/cm$^3$, for example. Alternatively, other n type dopants such as arsenic, antimony, or a combination thereof, may also be used.

The lightly doped region 50 and the source region 31 are of the same conductivity type and are within the well region 11. The concentration of the lightly doped region 50 is lower than that of the source region 31.

Likewise, the bit cell B comprises a gate region 21', a gate dielectric layer 41, a source region 31, a drain region 32 and the lightly doped region 50. The gate region 21' is disposed over the well region 11 and the gate dielectric layer 41 is disposed between the gate region 21' and the well region 11. According to an embodiment of the present disclosure, the gate dielectric layer 41 is silicon dioxide that is grown on the well 11 of the substrate by, for example, thermal oxidation, but not limited thereto. Other suitable gate dielectric materials may include, for example, oxide-nitride-oxide (ONO) or compound silicon oxide. The gate region 21' may comprise a doped polysilicon, but not limited thereto. Further, a silicide (not shown) may be formed on the gate region 21' in order to reduce contact resistance.

The bit cell B and the bit cell A share a same source region 31. The conductivity type of the drain region 32 of the bit cell B is the same as that of the source region 31. The drain region 32 may have a drain contact (not shown in the drawing). The drain region 32 is formed by implanting ions of an impurity of the same conductivity type, such as an n type, into the well region 11. The drain region 32 may be formed by implanting an n type dopant such as phosphorous at a concentration between about $1\times10^{19}$/cm$^3$ and about $2\times10^{21}$/cm$^3$, for example. Alternatively, other n type dopants such as arsenic, antimony, or a combination thereof, may also be used.

Similarly, the bit cell C comprises a gate region 22', a gate dielectric layer 42, a drain region 32, a source region 33 and the lightly doped region 50. The gate region 22' is disposed over the well region 11 and the gate dielectric layer 42 is disposed between the gate region 22' and the well region 11. According to an embodiment of the present disclosure, the gate dielectric layer 42 is silicon dioxide that is grown on the well 11 of the substrate by, for example, thermal oxidation, but not limited thereto. Other suitable gate dielectric materials may include, for example, oxide-nitride-oxide (ONO) or compound silicon oxide. The gate region 22' may comprise a doped polysilicon, but not limited thereto. Further, a silicide (not shown) may be formed on the gate region 22' in order to reduce contact resistance.

The bit cell B and the bit cell C share a same drain region 32. The conductivity type of the source region 33 of the bit cell C is the same as that of the drain region 32. The source region 33 may have a source contact (not shown in the drawing). The source region 33 is formed by implanting ions of an impurity of the same conductivity type, such as an n type, into the well region 11. The source region 33 may be formed by implanting an n type dopant such as phosphorous at a concentration between about $1\times10^{19}/cm^3$ and about $2\times10^{21}/cm^3$, for example. Alternatively, other n type dopants such as arsenic, antimony, or a combination thereof, may also be used.

Figure 1C:
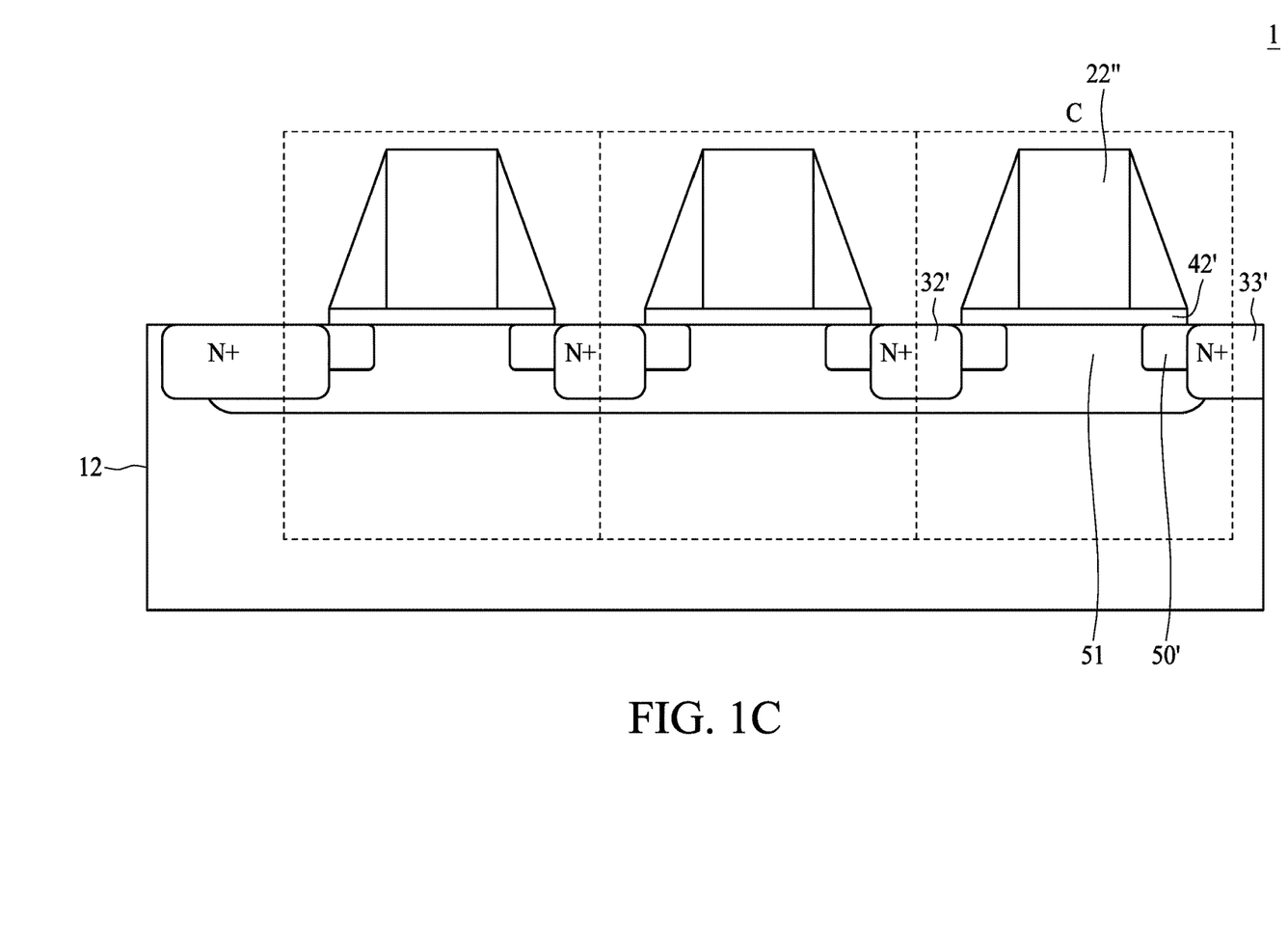

FIG. 1C is a cross-sectional view of a portion of the non-volatile memory array 1 shown in FIG. 1A, taken along the line Y-Y' in accordance with an embodiment of the present disclosure. The non-volatile memory 1 shown in FIG. 1C comprises a substrate (not shown), a well region 12 and a portion of the bit cell C.

The well region 12 extends continuously in the bit cell C. The doping concentration accounts for the well region 12 and the diffusion may vary as the process and design vary. Doping concentrations at a p type material or an n type material may range from $10^{14}$ atoms/$cm^3$ to $10^{22}$ atoms/$cm^3$, with a p+/n+ material having a concentration higher than about $10^{18}/cm^3$, for example. Some other ranges of concentration may be used, such as a n--/p-- material with a doping concentration lower than $10^{14}$ atoms/$cm^3$, a n-/p- material with a doping concentration ranging from $10^{14}$ atoms/$cm^3$ to $10^{16}$ atoms/$cm^3$, an n/p material with a doping concentration ranging from $10^{16}$ atoms/$cm^3$ to $10^{18}$ atoms/$cm^3$, an n+/p+ material with a doping concentration ranging from $10^{18}$ atoms/$cm^3$ to $10^{20}$ atoms/$cm^3$, and an n++/p++ material with a doping concentration higher than $10^{20}$ atoms/$cm^3$. Further alternative ranges of concentration may be used, such as an n--/p-- material with a doping concentration ranging around $10^{15}$ to $10^{18}/cm^3$, and an n-/p- material with a doping concentration 5 to 100 times heavier than the concentration of an n--/p-- material.

The bit cell C comprises a gate region 22", a gate dielectric layer 42', a drain region 32', a source region 33', a first lightly doped region 50' and a second lightly doped region 51. The gate region 22" is disposed over the well region 12 and the gate dielectric layer 42' is disposed between the gate region 22" and the well region 12. According to an embodiment of the present disclosure, the gate dielectric layer 42' is silicon dioxide that is grown on the well 12 of the substrate by, for example, thermal oxidation, but not limited thereto. Other suitable gate dielectric materials may include, for example, oxide-nitride-oxide (ONO) or compound silicon oxide. The gate region 22" may comprise a doped polysilicon, but not limited thereto. Further, a silicide (not shown) may be formed on the gate region 22" in order to reduce contact resistance.

The drain region 32' and the source region 33' are of the same conductivity type and are within the well region 12. The drain region 32' may have a drain contact (not shown in the drawing). The source region 33' may have a source contact (not shown in the drawing). Both the drain region 32' and the source region 33' are formed by implanting ions of an impurity of the same conductivity type, such as an n type, into the well region 12. The drain region 32' and the source region 33' may be formed by implanting an n type dopant such as phosphorous at a concentration between about $1\times10^{19}/cm^3$ and about $2\times10^{21}/cm^3$, for example. Alternatively, other n type dopants such as arsenic, antimony, or a combination thereof, may also be used.

The first lightly doped region 50' and the source region 33' are of the same conductivity type and are within the well region 12. The concentration of the first lightly doped region 50' is lower than that of the source region 33'.

The second lightly doped region 51 and the source region 33' are of the same conductivity type and are within the well region 12. The concentration of the second lightly doped region 51 is lower than that of the first lightly doped region 50'. The gate region 22" and the second lightly doped region 51 form a capacitor.

Figure 1D:
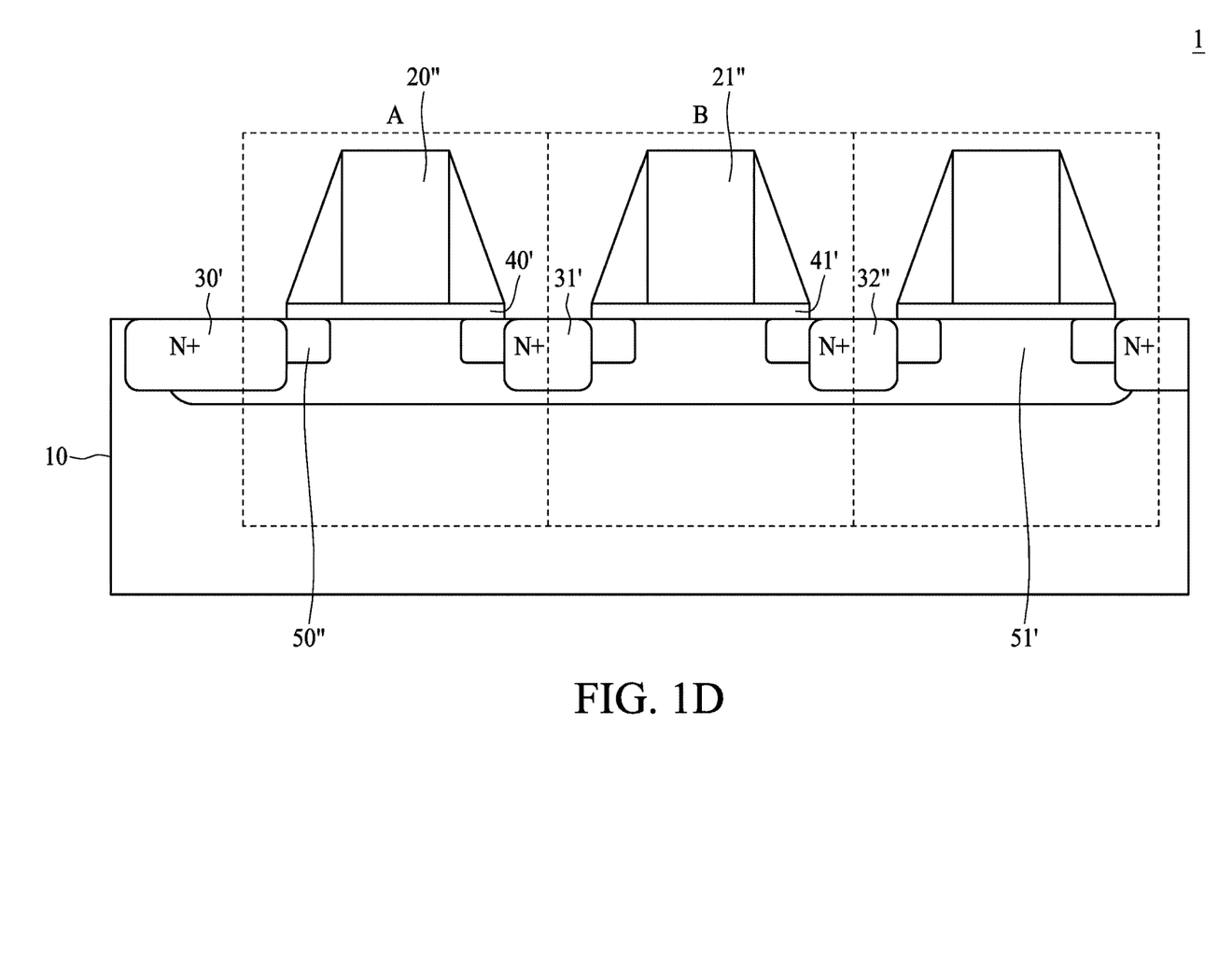

FIG. 1D is a cross-sectional view of a portion of the non-volatile memory array 1 shown in FIG. 1A, taken along the line Z-Z' in accordance with an embodiment of the present disclosure. The non-volatile memory 1 shown in FIG. 1D comprises a substrate (not shown), a well region 10 and a portion each of the bit cells A and B.

The well region 10 extends continuously in the bit cell A and the bit cell C. The doping concentration accounts for the well region 10 and the diffusion may vary as the process and design vary. Doping concentrations at a p type material or an n type material may range from $10^{14}$ atoms/$cm^3$ to $10^{22}$ atoms/$cm^3$, with a p+/n+ material having a concentration higher than about $10^{18}/cm^3$, for example. Some other ranges of concentrations may be used, such as an n--/p-- material with a doping concentration lower than $10^{14}$ atoms/$cm^3$, an n-/p- material with a doping concentration ranging from $10^{14}$ atoms/$cm^3$ to $10^{16}$ atoms/$cm^3$, an n/p material with a doping concentration ranging from $10^{16}$ atoms/$cm^3$ to $10^{18}$ atoms/$cm^3$, an n+/p+ material with a doping concentration ranging from $10^{18}$ atoms/$cm^3$ to $10^{20}$ atoms/$cm^3$, and an n++/p++ material with a doping concentration higher than $10^{20}$ atoms/$cm^3$. Further alternative ranges of concentrations may be used, such as an n--/p-- material with a doping concentration ranging around $10^{15}$ to $10^{18}/cm^3$, and an n-/p- material with a doping concentration 5 to 100 times heavier than the concentration of an n--/p-- material.

The bit cell A comprises a gate region 20", a gate dielectric layer 40', a drain region 30', a source region 31', a first lightly doped region 50" and a second lightly doped region 51'. The gate region 20" is disposed over the well region 10 and the gate dielectric layer 40' is disposed between the gate region 20" and the well region 10. According to an embodiment of the present disclosure, the gate dielectric layer 40' is silicon dioxide that is grown on the well 10 of the substrate by, for example, thermal oxidation, but not limited thereto. Other suitable gate dielectric materials may include, for example, oxide-nitride-oxide (ONO) or compound silicon oxide. The gate region 20" may comprise a doped polysilicon, but not limited thereto. Further, a silicide (not shown) may be formed on the gate region 20" in order to reduce contact resistance.

The drain region 30' and the source region 31' are of the same conductivity type and are within the well region 10. The drain region 30' may have a drain contact (not shown in the drawing). The source region 31' may have a source contact (not shown in the drawing). Both the drain region 30' and the source region 31' are formed by implanting ions of an impurity of the same conductivity type, such as an n type, into the well region 10. The drain region 30' and the source region 31' may be formed by implanting an n type dopant such as phosphorous at a concentration between about $1\times10^{19}/cm^3$ and about $2\times10^{21}/cm^3$, for example. Alternatively, other n type dopants such as arsenic, antimony, or a combination thereof, may also be used.

The first lightly doped region 50'' and the source region 31' are of the same conductivity type and are within the well region 10. The concentration of the first lightly doped region 50'' is lower than that of the source region 31'.

The second lightly doped region 51' and the source region 31' are of the same conductivity type and are within the well region 10. The concentration of the second lightly doped region 51' is lower than that of the first lightly doped region 50''. The gate region 20' and the second lightly doped region 51' form a capacitor.

The bit cell B comprises a gate region 21'', a gate dielectric layer 41', a drain region 32'', a source region 31', and first lightly doped region 50'' and a second lightly doped region 51'. The gate region 21'' is disposed over the well region 10 and the gate dielectric layer 41' is disposed between the gate region 21'' and the well region 10. According to an embodiment of the present disclosure, the gate dielectric layer 41' is silicon dioxide that is grown on the well 10 of the substrate by, for example, thermal oxidation, but not limited thereto. Other suitable gate dielectric materials may include, for example, oxide-nitride-oxide (ONO) or compound silicon oxide. The gate region 21'' may comprise a doped polysilicon, but not limited thereto. Further, a silicide (not shown) may be formed on the gate region 21'' in order to reduce contact resistance.

The drain region 32'' and the source region 31' are of the same conductivity type and are within the well region 10. The drain region 32'' may have a drain contact (not shown in the drawing). The source region 31' may have a source contact (not shown in the drawing). Both the drain region 32'' and the source region 31' are formed by implanting ions of an impurity of the same conductivity type, such as an n type, into the well region 10. The drain region 32'' and the source region 31' may be formed by implanting an n type dopant such as phosphorous at a concentration between about $1\times10^{19}/cm^3$ and about $2\times10^{21}/cm^3$, for example. Alternatively, other n type dopants such as arsenic, antimony, or a combination thereof, may also be used.

The gate region 20'' of the bit cell A shown in FIG. 1D is connected with the gate region 20' of the bit cell A shown in FIG. 1B. The gate region 21'' of the bit cell B shown in FIG. 1D is connected with the gate region 21' of the bit cell B shown in FIG. 1B. The gate region 22'' of the bit cell C shown in FIG. 1C is connected with the gate region 22' of the bit cell C shown in FIG. 1B.

The first lightly doped region 50'' and the source region 31' are of the same conductivity type and are within the well region 10. The concentration of the first lightly doped region 50'' is lower than that of the source region 31'.

The second lightly doped region 51' and the source region 31' are of the same conductivity type and are within the well region 10. The concentration of the second lightly doped region 51' is lower than that of the first lightly doped region 50''. The gate region 20' and the second lightly doped region 51' form a capacitor.

As shown in FIGS. 1B-1D, the gate regions of two adjacent bit cells that share a same source region extend over a same pair of well regions, while the gate regions of two adjacent bit cells that share a same drain region extend over a different pair of well regions. As such, the wrongly writing operation can be avoided without using an isolation element (such as STI) to separate the well region of two adjacent bit cells. Therefore, the non-volatile memory array of the present disclosure has a smaller area in comparison with the existing non-volatile memory array.

Figure 2:
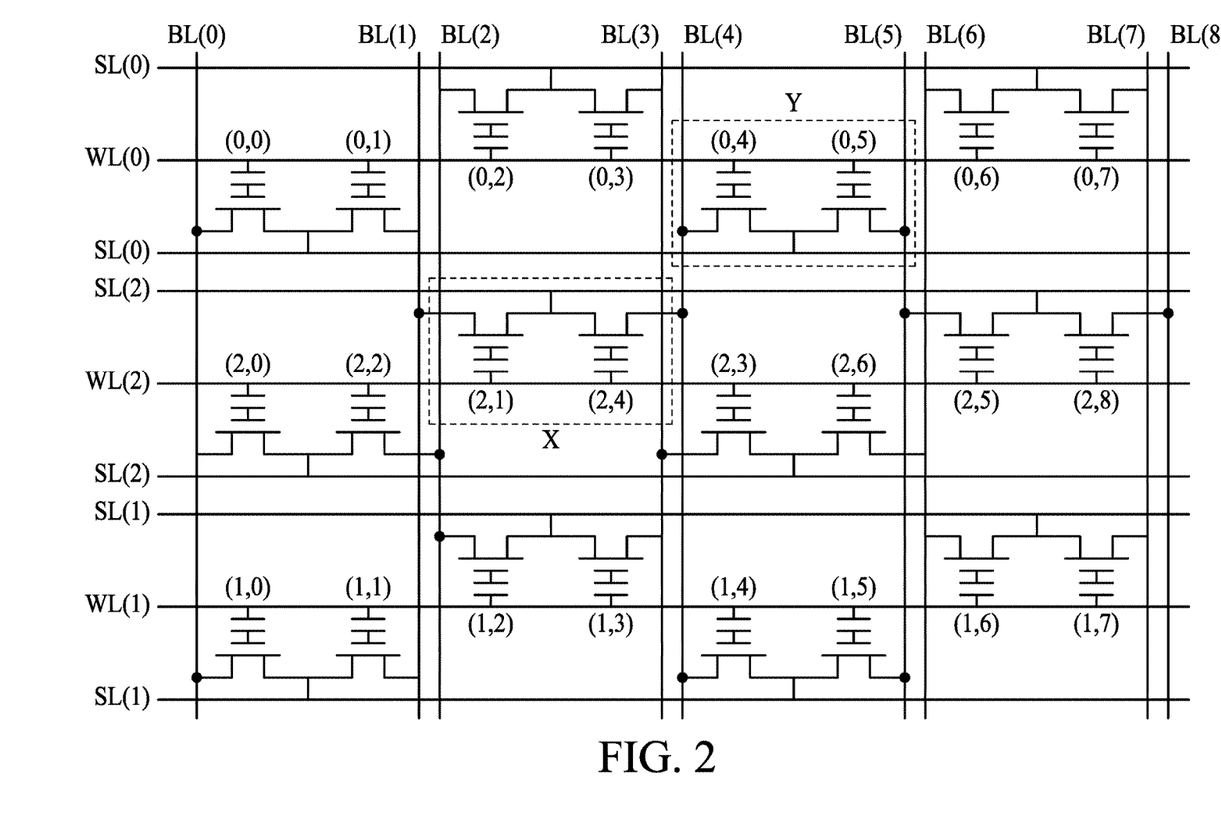
FIG. 2 is a schematic diagram of a non-volatile memory array, in accordance with some embodiments.

FIG. 2 is an illustrative diagram of an array of a non-volatile memory 2 in accordance with an embodiment of the present disclosure. The non-volatile memory array 2 comprises several pairs of cells each having two MOSFETs.

In each pair of cells, the gate terminals of both MOSFETs are connected to a same word line and the source terminals of both MOSFETs are connected to a same source line. For example, in the pair of cell X, both of the gate terminals of the MOSFET (2, 1) and the MOSFET (2, 4) are connected to the word line WL(2) and both of the source terminals of the MOSFET (2, 1) and the MOSFET (2, 4) are connected to the source line SL(2).

For two adjacent MOSFETs which do not belong to the same pair, the drain terminals of both MOSFETs are connected to a same bit line, while the gate terminals of both MOSFETs are connected to different word lines. For example, both of the drain terminals of the MOSFET (2, 4) in the pair of cell X and the MOSFET (0, 4) in the pair of cell Y are connected to the bit line BL(4) while the gate terminals of the MOSFET (2, 4) and MOSFET (0, 4) are connected to different word lines. Specifically, the gate terminals of the MOSFET (2, 4) and MOSFET (0, 4) are connected to the word line WL(2) and word line WL(0), respectively.

When a logical value 0 is written to the MOSFET (2, 4) during a write operation, a positive voltage is applied to the word line WL(2) and a voltage of zero is applied to the bit line BL(4). Because the gate terminals of the MOSFET (2, 4) and its adjacent MOSFET (0, 4) are connected to different word lines, it can be ensured that the logical value 0 would not be wrongly written to the MOSFET (0, 4) even if the MOSFET (2, 4) and MOSFET (0, 4) both are connected to the same bit line BL(4).

In view of the above, the present disclosure provides a high performance non-volatile memory array to overcome the problems in some existing non-volatile memory arrays. The non-volatile memory array of the present disclosure can avoid a logical value being written to unselected bit cells without separating active regions or well regions. Therefore, a chip with a smaller area can be obtained by using continuously extending active regions or well regions, thereby reducing the manufacturing cost and enhancing the chip density.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Embodiments of the present disclosure provide a semiconductor device comprising a first active region, a second active region and a third active region, a first poly region, a second poly region, a third poly region, a first doped region and a second doped region. The first active region, the second active region and the third active region are separated from each other and substantially arranged in parallel with each other. The first poly region is arranged over the first active region and the second active region. The second poly region is arranged over the first active region and the second active region. The third poly region is arranged over the second active region and the third active region. The first doped region is in the second active region and between the first poly region and the second poly region. The second doped region is in the second active region and between the second poly region and the third poly region.

Embodiments of the present disclosure provide a semiconductor device, comprising a first well region, a second well region, a third well region, a first gate region, a second gate region, a third gate region, a fourth gate region and a first drain region. The second well region extends in parallel with the first well region. The third well region extends in parallel with the first and the second well regions. The first gate region is disposed over the first well region. The second gate region is disposed over the second well region and connecting to the first gate region. The third gate region is disposed over the third well region. The fourth gate region is disposed over the second well region and connecting to the third gate region. The first drain region is within the second well region and between the second gate region and the fourth gate region.

Embodiments of the present disclosure provide a non-volatile memory array, comprising a first pair of memory cell and a second pair of memory cell adjacent to the first pair of memory cell. The first pair of memory cell and the second pair of memory cell are connected to a same bit line. The first pair of memory cell and the second pair of memory cell are connected to different word lines.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:

1. A semiconductor device, comprising:
a first active region, a second active region and a third active region being separated from each other and substantially arranged in parallel with each other;
a first poly region arranged over the first active region and the second active region;
a second poly region arranged over the first active region and the second active region;
a third poly region arranged over the second active region and the third active region;
a first doped region in the second active region and between the first poly region and the second poly region; and
a second doped region in the second active region and between the second poly region and the third poly region.

2. The semiconductor device of claim 1, further comprising a plurality of active regions and poly regions, wherein each poly region and its adjacent poly region extend over a same pair of active regions if the first doped region is located between the each and its adjacent poly regions.

3. The semiconductor device of claim 1, further comprising a plurality of active regions and poly regions, wherein each poly region and its adjacent poly region extend over a different pair of active regions if the second doped region is located between the each and its adjacent poly regions.

4. The semiconductor device of claim 1, wherein the first doped region is a source region and the second doped region is a drain region.

5. The semiconductor device of claim 1, wherein a ratio of an overlapped area between the first poly region and the first active region to an overlapped area between the first poly region and the second active region is greater than one.

6. The semiconductor device of claim 1, wherein the first doped region is shared by the first poly region and the second poly region, and the second doped region is shared by the second poly region and the third poly region.

7. The semiconductor device of claim 1, wherein the second active region extends continuously below the first poly region, the second poly region and the third poly region.

8. A semiconductor device, comprising:
a first well region;
a second well region extending in parallel with the first well region;
a third well region extending in parallel with the first and second well regions;
a first gate region disposed over the first well region;
a second gate region disposed over the second well region connecting the first gate region;
a third gate region disposed over the third well region;
a fourth gate region disposed over the second well region and connecting the third gate region; and
a first drain region within the second well region and between the second gate region and the fourth gate region.

9. The semiconductor device of claim 8, further comprising:
a fifth gate region disposed over the second well region;
a sixth gate region disposed over the first well region and connecting the fifth gate region; and
a first source region within the second well region and between the fifth gate region and the second gate region.

10. The semiconductor device of claim 8, further comprising a first lightly doped region within the second well region and adjacent to the first drain region, wherein the concentration of the first lightly doped region is lower than that of the first drain region.

11. The semiconductor device of claim 9, further comprising a second lightly doped region within the second well region and adjacent to the first source region, wherein the concentration of the second lightly doped region is lower than that of the first source region.

12. The semiconductor device of claim 10, further comprising:
a fifth gate region disposed over the second well region;
a sixth gate region disposed over the first well region and connecting the fifth gate region;
a first source region within the second well region and between the fifth gate region and the second gate region; and
a second lightly doped region within the second well region and adjacent to the first source region, wherein the concentration of the second lightly doped region is lower than that of the first source region.

13. The semiconductor device of claim 8, further comprising a third lightly doped region within the second well region and below the third gate region.

14. The semiconductor device of claim 8, further comprising a fourth lightly doped region within the first well region and below the first gate region.

15. The semiconductor device of claim 8, wherein the second well region extends continuously below the second gate region and the fourth gate region.

16. A non-volatile memory array, comprising:
a first pair of memory cell wherein the first pair of memory cell further comprises:
a first MOSFET having a first gate region; and
a second MOSFET having a second gate region; and
a second pair of memory cell adjacent to the first pair of memory cell, wherein the second pair of memory cell includes a third MOSFET having a third gate region and a fourth MOSFET;
wherein the second MOSFET of the first pair of memory cell and third MOSFET of the second pair of memory cell are connected to a same bit line; and
wherein the first gate region and the second gate region of the first pair of memory cell extend over and connect to a first active region providing a first word line and the third gate region of the second pair of memory cell extends over and connects to a second active region providing a second word line different than the first word line.

17. The non-volatile memory array of claim 16,
wherein a source of the first MOSFET and a source of the second MOSFET are connected to the same source line; and
the first gate region of the first MOSFET and the second gate region of the second MOSFET are connected to the first word line.

18. The non-volatile memory array of claim 17, wherein a drain of the second MOSFET and a drain of the third MOSFET are connected to the same bit line.

19. The non-volatile memory array of claim 16, further comprising a plurality of additional MOSFETs, wherein gates of each additional MOSFET and its adjacent MOSFET are connected to a same word line if sources of an additional MOSFET of the plurality of additional MOSFETs and its adjacent MOSFET of the plurality of additional MOSFETs are connected to each other.

20. The non-volatile memory array of claim 16, wherein the same bit line includes a first doped region between the second gate region of the second MOSFET and the third gate region of the third MOSFET.

* * * * *